United States Patent
Watanabe

(10) Patent No.: US 10,673,406 B2
(45) Date of Patent: Jun. 2, 2020

(54) PIEZOELECTRIC DEVICE

(71) Applicant: NIHON DEMPA KOGYO CO., LTD., Tokyo (JP)

(72) Inventor: Yoshihiro Watanabe, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 309 days.

(21) Appl. No.: 15/793,988

(22) Filed: Oct. 26, 2017

(65) Prior Publication Data
US 2018/0123559 A1    May 3, 2018

(30) Foreign Application Priority Data

Oct. 28, 2016 (JP) ................................ 2016-211609

(51) Int. Cl.
| | | |
|---|---|---|
| *H03H 9/19* | (2006.01) | |
| *H03H 3/02* | (2006.01) | |
| *H01L 41/047* | (2006.01) | |
| *H03H 9/05* | (2006.01) | |
| *H01L 41/053* | (2006.01) | |
| *H03H 9/10* | (2006.01) | |
| *H03H 9/21* | (2006.01) | |

(52) U.S. Cl.
CPC ........... *H03H 9/19* (2013.01); *H01L 41/0477* (2013.01); *H01L 41/053* (2013.01); *H03H 3/02* (2013.01); *H03H 9/0509* (2013.01); *H03H 9/0519* (2013.01); *H03H 9/1021* (2013.01); *H03H 9/21* (2013.01); *H03H 2003/022* (2013.01)

(58) Field of Classification Search
CPC ...... H03H 9/19; H03H 9/0519; H03H 9/1021; H03H 3/02; H03H 9/0509; H03H 9/21; H03H 2003/022; H01L 41/0477; H01L 41/053
See application file for complete search history.

(56) References Cited

U.S. PATENT DOCUMENTS

| | | | | |
|---|---|---|---|---|
| 2008/0157630 A1* | 7/2008 | Takahashi | ............ | H03H 9/0547 310/328 |
| 2010/0207696 A1* | 8/2010 | Sayama | ............... | H03H 9/0519 331/158 |

(Continued)

FOREIGN PATENT DOCUMENTS

JP          2003309446          10/2003

*Primary Examiner* — Bryan P Gordon
(74) *Attorney, Agent, or Firm* — JCIPRNET

(57) ABSTRACT

A piezoelectric device is provided and includes: a piezoelectric vibrating piece, having an outer shape in rectangular shape and including an excitation electrode formed on both principal surfaces which are a top surface and a lower surface, an electrode pad formed at both ends of one short side, and an extraction electrode extracted from the excitation electrode to the electrode pad to be electrically connected to the electrode pad; a package, including a placement surface on which the piezoelectric vibrating piece is placed as opposed to the lower surface of the piezoelectric vibrating piece, and an adhesion pad formed on the placement surface; and a conductive adhesive, securing the piezoelectric vibrating piece to the package and electrically connecting the adhesion pad to the electrode pad. An adhesive is applied on the top surface of the piezoelectric vibrating piece and between the conductive adhesive and the excitation electrode.

5 Claims, 7 Drawing Sheets

(56) References Cited

U.S. PATENT DOCUMENTS

| | | | | |
|---|---|---|---|---|
| 2011/0221535 A1* | 9/2011 | Sakaba | ............... | H03H 9/0509 |
| | | | | 331/68 |
| 2012/0242193 A1* | 9/2012 | Shimao | ............... | H03H 9/1021 |
| | | | | 310/348 |
| 2013/0187723 A1* | 7/2013 | Harima | ................... | H03B 5/36 |
| | | | | 331/158 |
| 2015/0015118 A1* | 1/2015 | Kamijo | ............... | H03H 9/1021 |
| | | | | 310/344 |
| 2016/0164490 A1* | 6/2016 | Kamijo | ............... | H03H 9/0509 |
| | | | | 310/348 |

* cited by examiner

PIEZOELECTRIC DEVICE

CROSS-REFERENCE TO RELATED APPLICATIONS

This application is based on and claims priority under 35 U.S.C. § 119 to Japanese Patent Application No. 2016-211609, filed on Oct. 28, 2016 the entire content of which is incorporated herein by reference.

TECHNICAL FIELD

This disclosure relates to a piezoelectric device having a piezoelectric vibrating piece on which an adhesive is applied.

DESCRIPTION OF THE RELATED ART

When a piezoelectric vibrating piece having a piezoelectric substrate on which an excitation electrode is formed is vibrated at a predetermined frequency, unnecessary vibration having a frequency different from that of main vibration is generated together with the main vibration. To prevent the generation of such unnecessary vibration, for example, Japanese Unexamined Patent Application Publication No. 2003-309446 shows that an adhesive is applied on a region where the excitation electrode is not formed on a principal surface of the piezoelectric substrate to perform weighting, thus reducing the unnecessary vibration generated on the piezoelectric substrate.

However, when the adhesive is applied on the piezoelectric substrate as shown in Japanese Unexamined Patent Application Publication No. 2003-309446, compared with a piezoelectric device on which such adhesive is not applied, temperature characteristic such as crystal impedance (CI) is possibly degraded. In ensuring high accuracy of the piezoelectric device, especially, slight undulation of the frequency whose frequency change rate is 0.2 ppm or less in the unnecessary vibration causes a problem. It is not clear how the method that applies the adhesive on the piezoelectric substrate influences this slight undulation of the frequency. Since this slight undulation of the frequency is a complex system of a plurality of modes of vibration, it is difficult to solve this problem also by simulation.

A need thus exists for a piezoelectric device which is not susceptible to the drawback mentioned above.

SUMMARY

According to an aspect of this disclosure, there is provided a piezoelectric device of a first aspect includes a piezoelectric vibrating piece, a package, and a conductive adhesive. The piezoelectric vibrating piece has an outer shape formed into a rectangular shape and includes an excitation electrode formed on both principal surfaces which are a top surface and a lower surface, an electrode pad formed at both ends of one short side, and an extraction electrode extracted from the excitation electrode to the electrode pad to be electrically connected to the electrode pad. The package includes a placement surface on which the piezoelectric vibrating piece is placed as opposed to the lower surface of the piezoelectric vibrating piece and an adhesion pad formed on the placement surface. The conductive adhesive secures the piezoelectric vibrating piece to the package and electrically connects the adhesion pad to the electrode pad. At the piezoelectric vibrating piece, an adhesive is applied on the top surface of the piezoelectric vibrating piece, and the adhesive is between the conductive adhesive and the excitation electrode.

BRIEF DESCRIPTION OF THE DRAWINGS

The foregoing and additional features and characteristics of this disclosure will become more apparent from the following detailed description considered with reference to the accompanying drawings, wherein:

FIG. 7 is a perspective view of a piezoelectric device 100 which includes an integrated circuit chip that has an oscillator circuit and a temperature compensation function built-in.

DETAILED DESCRIPTION

The embodiments of this disclosure will be described in detail with reference to the drawings. The embodiments in the following description do not limit the scope of the disclosure unless otherwise stated.

Configuration of Piezoelectric Device 100 According to First Embodiment

Figure 1A:
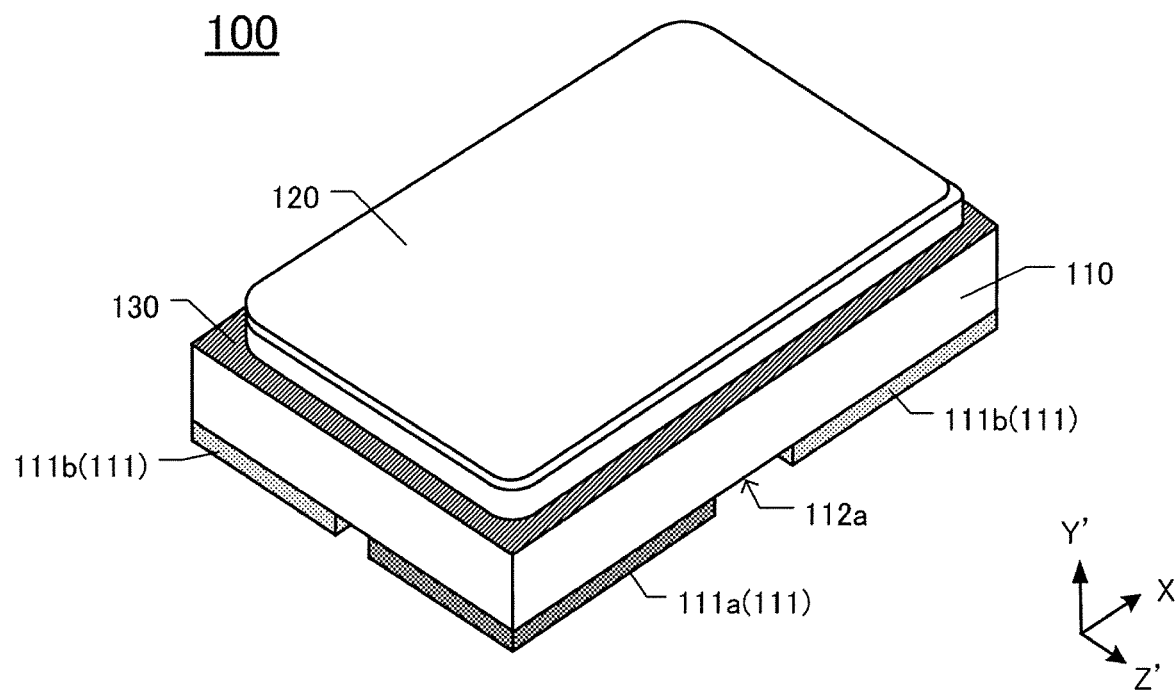
FIG. 1A is a perspective view of a piezoelectric device 100.

FIG. 1A is a perspective view of a piezoelectric device 100. The piezoelectric device 100 mainly includes a package 110, a lid 120, and a piezoelectric vibrating piece 140 (see FIG. 1B) that vibrates at a predetermined frequency. The piezoelectric device 100 has an outer shape formed into, for example, an approximately rectangular parallelepiped shape. The piezoelectric vibrating piece 140 is, for example, an AT-cut quartz-crystal vibrating piece. The AT-cut crystal is formed having a principal surface (X-Z surface) that is tilted by 35° 15' from a Z-axis to a −Y-axis about an X-axis with respect to a Y-axis of crystallographic axes (XYZ). In the following descriptions, a new axis tilted on which the AT-cut crystal is inclined is denoted as a Y'-axis and a Z'-axis. The piezoelectric device 100 has a long side extending parallel to the X-axis and a short side extending parallel to the Z'-axis. The Y'-axis extends perpendicular to the X-axis and the Z'-axis.

A mounting surface 112a is a surface at the −Y'-axis side of the package 110 and a surface on which the piezoelectric device 100 is mounted. Mounting terminals 111 are formed on the mounting surface 112a. The mounting terminals 111 includes hot terminals 111a that are terminals connected to the piezoelectric vibrating piece 140, and terminals (hereinafter temporarily referred to as grounding terminals) 111b that can be used for grounding. At the package 110, the hot terminals 111a are each formed at a corner of a −Z'-axis side on the +X-axis side and a corner of the +Z'-axis side on a X-axis side of the mounting surface 112a, and the grounding terminals 111b are each formed at a corner of a +Z'-axis side on the +X-axis side and a corner of a −Z'-axis side on the −X-axis side of the mounting surface 112a. On a surface at the +Y'-axis side of the package 110, a cavity 113 that is a space where the piezoelectric vibrating piece 140 is placed is formed (see FIG. 1B). The cavity 113 is sealed by the lid 120 via a sealing material 130.

Figure 1B:
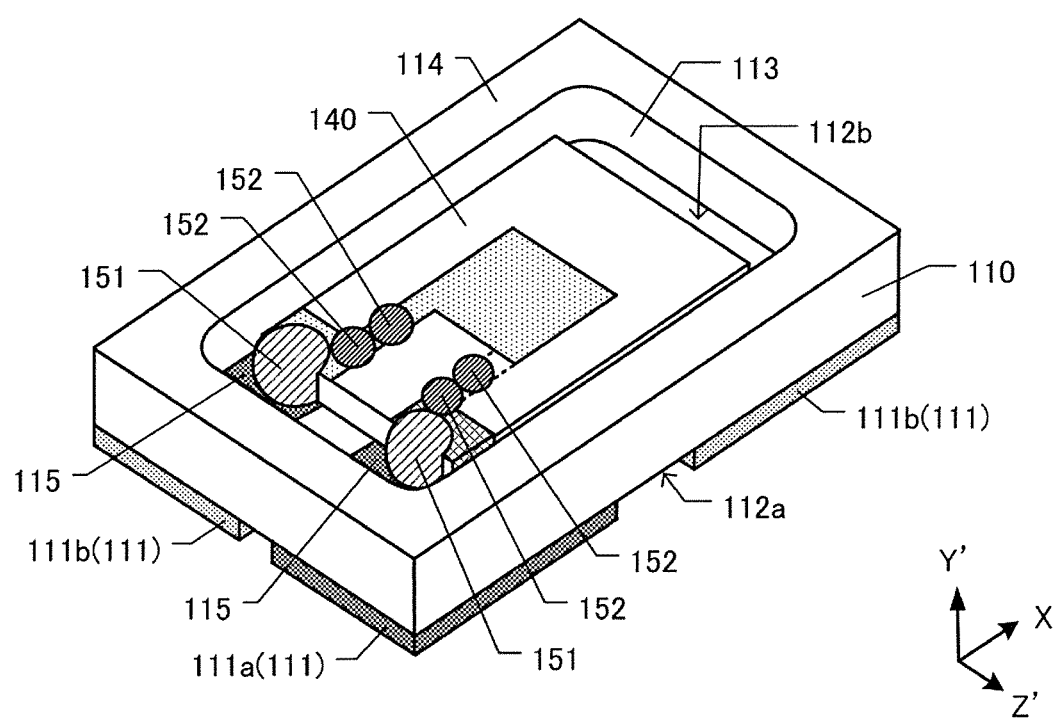
FIG. 1B is a perspective view of the piezoelectric device 100 from which a lid 120 has been removed.

FIG. 1B is a perspective view of the piezoelectric device 100 from which the lid 120 has been removed. The cavity 113 formed on the surface at the +Y'-axis side of the package 110 is surrounded by a placement surface 112b and a sidewall 114. The placement surface 112b is a surface at an opposite side of the mounting surface 112a. The piezoelectric vibrating piece 140 is placed on the placement surface 112b. The sidewall 114 is formed in a peripheral area of the placement surface 112b. On the placement surface 112b, a pair of adhesion pads 115 electrically connected to the hot terminals 111a are formed. The piezoelectric vibrating piece 140 is placed on the placement surface 112b of the package 110 with conductive adhesives 151. On the surface at the +Y'-axis side of the piezoelectric vibrating piece 140, a plurality of adhesives 152 are applied.

Figure 2A:
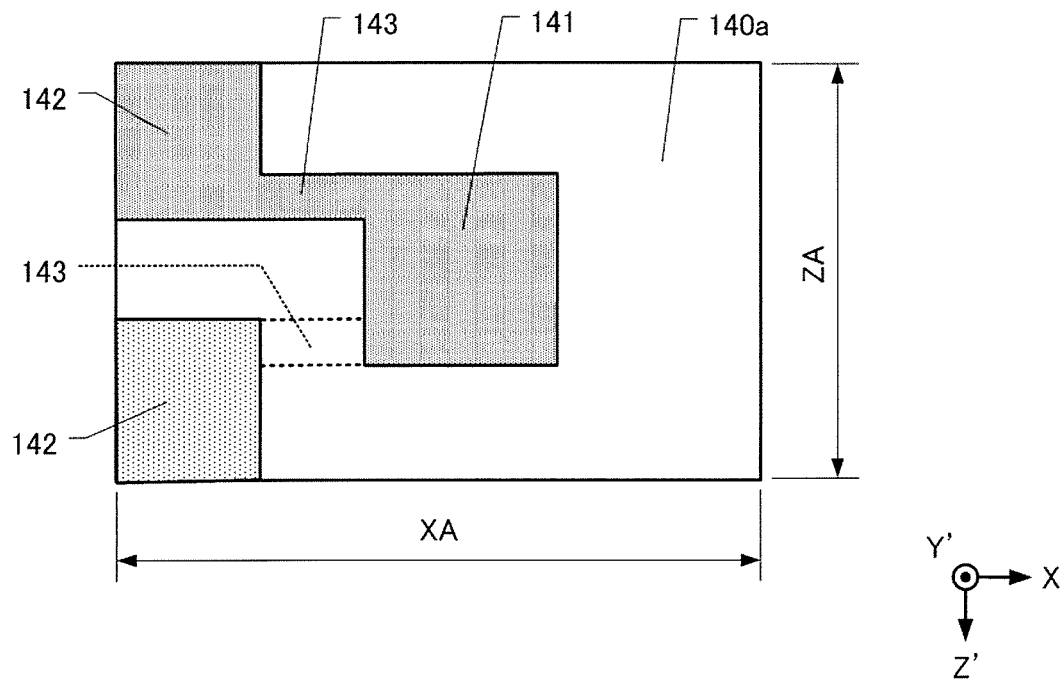
FIG. 2A is a plan view of a piezoelectric vibrating piece 140.

FIG. 2A is a plan view of the piezoelectric vibrating piece 140. The piezoelectric vibrating piece 140 is formed into a rectangular shape having long sides extending in the X-axis direction and short sides extending in the Z'-axis direction. The surface at the +Y'-axis side and the surface at the −Y'-axis side are formed as principal surfaces. In the following descriptions, the principal surface at the +Y'-axis side of the piezoelectric vibrating piece 140 is a top surface 140a, and the principal surface at the Y'-axis side of the piezoelectric vibrating piece 140 is a lower surface 140b. On each of the top surface 140a and the lower surface 140b, an excitation electrode 141 is formed. At both ends of the short sides at the −X-axis sides of the top surface 140a and the lower surface 140b of the piezoelectric vibrating piece 140, electrode pads 142 are each formed. Among the electrode pads 142, the electrode pads 142 formed at −Z'-axis sides of the top surface 140a and the lower surface 140b are electrically connected one another via a side surface of the piezoelectric vibrating piece 140, and the electrode pads 142 formed at the +Z'-axis sides of the top surface 140a and the lower surface 140b are electrically connected one another via the side surface of the piezoelectric vibrating piece 140. The excitation electrode 141 formed on the top surface 140a and the electrode pad 142 formed at the −Z'-axis side of the top surface 140a are electrically connected by an extraction electrode 143. The excitation electrode 141 formed on the lower surface 140b and the electrode pad 142 formed at the +Z'-axis side of the lower surface 140b are electrically connected by an extraction electrode 143 (indicated with the dotted line in FIG. 2A). The long side of the piezoelectric vibrating piece 140 has a length with XA. The short side of the piezoelectric vibrating piece 140 has a length with ZA. The length XA is 3.2 mm, and the length ZA is 1.8 mm.

Figure 2B:
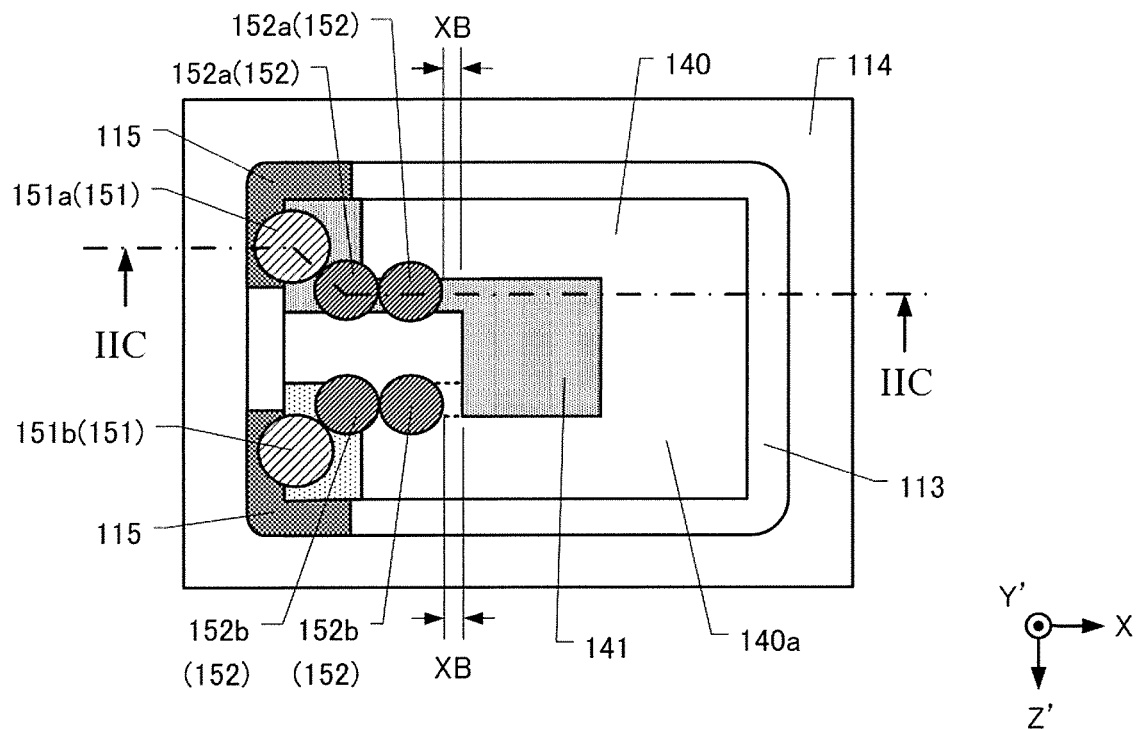
FIG. 2B is a plan view of the piezoelectric device 100 from which the lid 120 has been removed.

FIG. 2B is a plan view of the piezoelectric device 100 from which the lid 120 has been removed. The piezoelectric vibrating piece 140 is secured to an inside of the cavity 113 with the conductive adhesives 151. On the top surface 140a of the piezoelectric vibrating piece 140, the adhesives 152 are applied between the conductive adhesives 151 and the excitation electrode 141. In FIG. 2B, the conductive adhesive 151 applied at the −Z'-axis side of the piezoelectric vibrating piece 140 is used as a conductive adhesive 151a, and the conductive adhesive 151 applied at the +Z'-axis side of the piezoelectric vibrating piece 140 is used as a conductive adhesive 151b. The adhesive 152 applied on between the conductive adhesive 151a and the excitation electrode 141 is used as an adhesive 152a. The adhesive 152 applied on between the conductive adhesive 151b and the excitation electrode 141 is used as an adhesive 152b.

The adhesive 152a is formed to contact the conductive adhesive 151a and extend from the conductive adhesive 151a to the excitation electrode 141 side. A distance between the adhesive 152a and the excitation electrode 141 is XB. The adhesive 152b is formed to contact the conductive adhesive 151b and extend from the conductive adhesive 151b to the excitation electrode 141 side. A distance between the adhesive 152b and the excitation electrode 141 is XB. The adhesive 152a is applied as dots on the extraction electrode 143 formed on the top surface 140a. The adhesive 152b is applied as dots at a position overlapping the extraction electrode 143 formed on the lower surface 140b in the Y'-axis direction. The adhesive 152 is formed of, for example, a silicon-based adhesive. The adhesive 152 may be conductive or may be non-conductive.

Figure 2C:
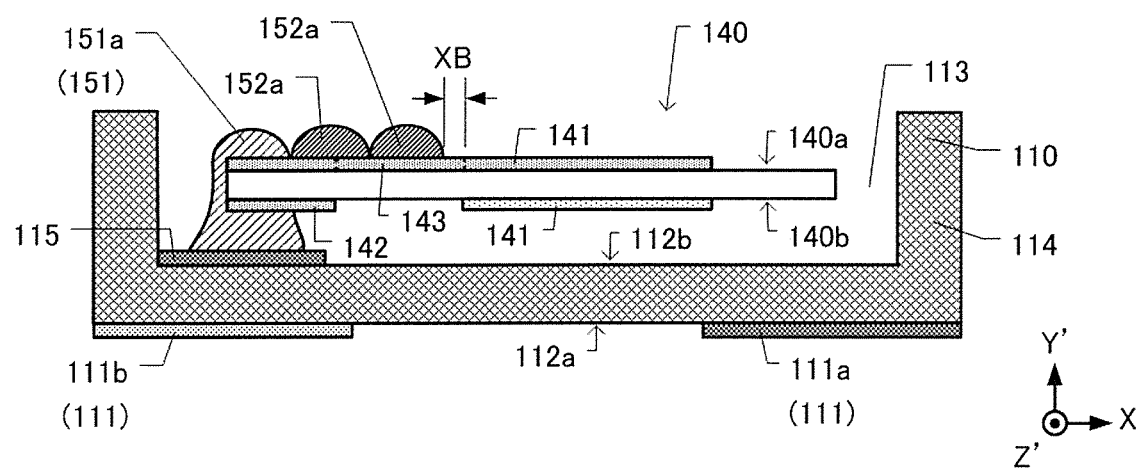
FIG. 2C is a sectional drawing taken along the line IIC-IIC in FIG. 2B.

FIG. 2C is a sectional drawing taken along the lune IIC-IIC in FIG. 2B. The piezoelectric vibrating piece 140 is placed on and secured to the placement surface 112b such that the conductive adhesives 151 are applied so as to connect the top surface 140a to the lower surface 140b of the piezoelectric vibrating piece 140. At the piezoelectric vibrating piece 140, by thus applying the conductive adhesives 151 on the top surface 140a and the lower surface 140b of the piezoelectric vibrating piece 140, the piezoelectric vibrating piece 140 is firmly secured onto the placement surface 112b, thus improving impact resistance as the piezoelectric device. The conductive adhesives 151 electrically connect the electrode pads 142 formed on the top surface 140a and the lower surface 140b of the piezoelectric vibrating piece 140 to the adhesion pads 115 formed on the placement surface 112b.

[Effect of Piezoelectric Device 100]

A temperature characteristic of the frequency of the AT-cut quartz-crystal vibrating piece can be approximated by a third-order approximated curve or a further higher order approximated curve. A temperature compensation type crystal controlled oscillator (TCXO) constituted using the AT-cut quartz-crystal vibrating piece outputs oscillation output compensated for the temperature characteristic of the above-described quartz-crystal vibrating piece. The temperature compensation type crystal controlled oscillator shows high frequency stability in a wide temperature range. However, the temperature compensation type crystal controlled oscillator is also required to reduce slight frequency variation with 0.2 ppm or less for ensuring high accuracy of the piezoelectric device. Such slight frequency variation is estimated to be generated by composition of a plurality of modes of vibration. Thus, it is difficult to solve it by simulation. The temperature characteristic of the conventional piezoelectric device has low design robustness. Thus, when the adhesive is applied on the piezoelectric vibrating piece, this raises the possibility of breaking the temperature characteristic of the piezoelectric device. The following describes an effect of the piezoelectric device 100, while comparing the piezoelectric device 100 with the conventional piezoelectric device.

Figure 3A:
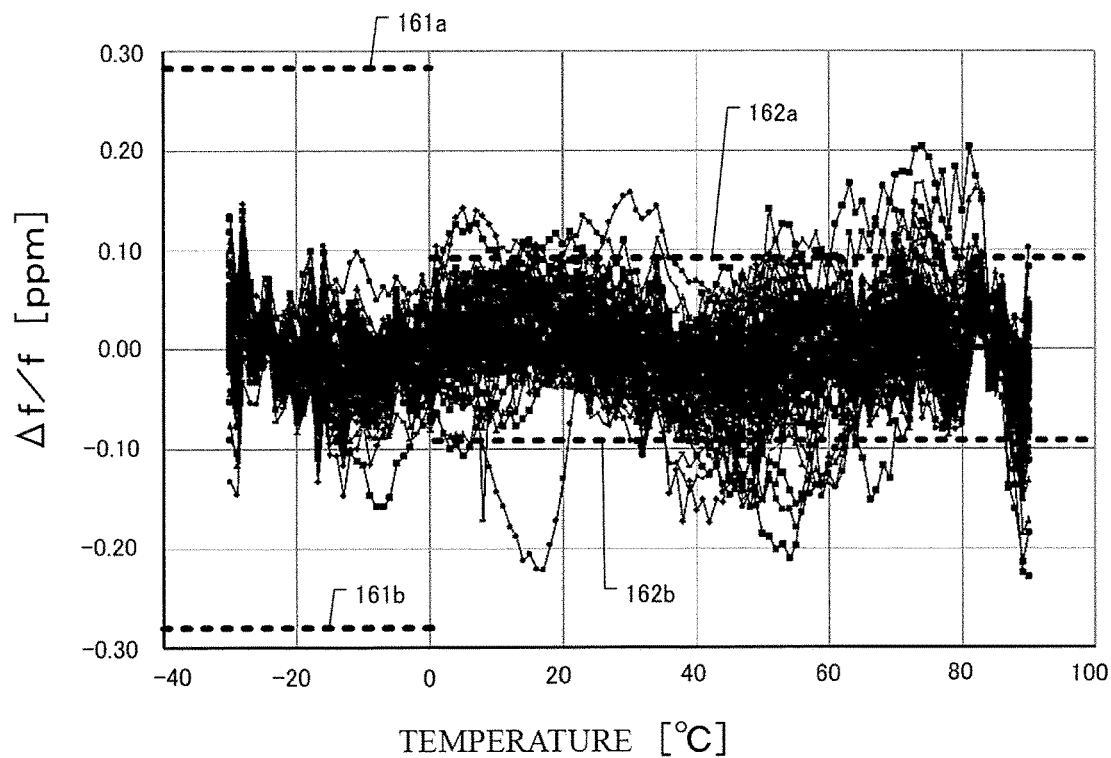
FIG. 3A is a graph that obtains differences between temperature characteristics actually measured by samples and fourth-order approximation properties approximated from these actually measured temperature characteristics (Δf, hereinafter referred to as a "difference from the approximation property") at a conventional piezoelectric device by measurement temperatures, and then, divides these differences by a an objective oscillation frequency (f) to convert them into ppm values (hereinafter referred to as Δf/f), thus plotting them with respect to the temperature.

FIG. 3A is a graph that obtains differences between the temperature characteristics actually measured by samples and fourth-order approximation properties approximated from these actually measured temperature characteristics (Δf, hereinafter referred to as a "difference from the approximation property") at the conventional piezoelectric device by measurement temperatures, and then, divides these differences by a an objective oscillation frequency (f) to convert them into ppm values (hereinafter referred to as Δf/f), thus plotting them with respect to the temperature. The oscillation frequency (f) is 38.4 MHz. The number of the samples is 97 pieces. The horizontal axis is the temperature (° C.), and the vertical axis is Δf/f (ppm). Here, the conventional piezoelectric device is a piezoelectric device 100 on which the adhesives 152 are not applied. Therefore, FIG. 3A presents displacement with respect to the above-described approximation properties of the temperature characteristics of the actual Δf/f by 97 pieces of sample. In a standard of the above-described differences required for the crystal unit for high-accuracy TCXO is, for example, Δf/f is within ±0.28 ppm at −40° C. to 0° C., and Δf/f is within ±0.09 ppm at 0° C. to 85° C. In FIG. 3A, a dotted line 161a at which Δf/f indicates +0.28 ppm and a dotted line 161b at which Δf/f indicates −0.28 ppm are shown in a range of −40° C. to 0° C. A dotted line 162a at which Δf/f indicates +0.09 ppm and a dotted line 162b at which Δf/f indicates −0.09 ppm are shown in a temperature range of more than 0° C. The reason using the fourth-order approximation is that the fourth-order approximation is a proper order in consideration of ensuring of an approximate accuracy and difficulty of approximate work. Therefore, the order of approximation is not limited to this.

At the conventional piezoelectric device shown in FIG. 3A, in the temperature range of −30° C. to 0° C., Δf/f is within ±0.28 ppm, and within a standard range. On the other hand, in the temperature range of 0° C. or more, for a plurality of conventional piezoelectric devices, in temperature ranges of about 0° C. to about 40° C. and about 50° C. to about 85° C., Δf/f exceeds +0.09 ppm to be large. In temperature ranges of about 0° C. to about 20° C. and about 30° C. to about 70° C., Δf/f exceeds −0.09 ppm to be small. Therefore, at the conventional piezoelectric device, even if an overall trend with respect to the temperature of the frequency indicates a trend close to a fourth-order approximated curve, since slight undulation with 0.2 ppm or less occurs at Δf/f, in the temperature range of 0° C. or more, Δf/f is not within the standard.

Figure 3B:
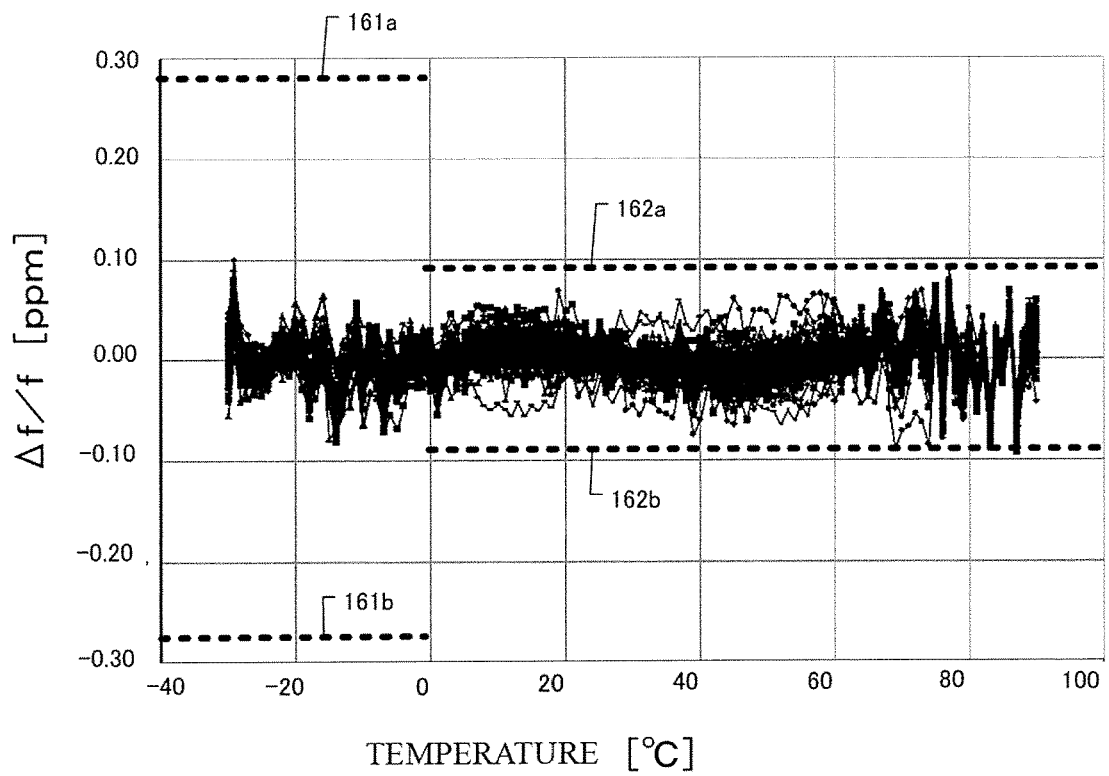
FIG. 3B is a graph showing a relation between the temperature and Δf/f of the piezoelectric device 100.

FIG. 3B is a graph showing a relation between the temperature and Δf/f of the piezoelectric device 100. In FIG. 3B, for 90 pieces of the piezoelectric device 100, Δf/f in a temperature range of −30° C. to 90° C. is shown. In FIG. 3B, the horizontal axis indicates the temperature [° C.], and the vertical axis indicates Δf/f [ppm]. In FIG. 3B, similarly to FIG. 3A, the dotted line 161a at which Δf/f indicates +0.28 ppm and the dotted line 161b at which Δf/f indicates −0.28 ppm are shown in the range of −40° C. to 0° C. The dotted line 162a at which Δf/f indicates +0.09 ppm and the dotted line 162b at which Δf/f indicates −0.09 ppm are shown in the temperature range of more than 0° C.

At the piezoelectric device 100, in the temperature range of −30° C. to 0° C., Δf/f is within a range of ±0.10 ppm. Thus, the standard that Δf/f is within ±0.28 ppm is sufficiently satisfied. Also in the temperature range of 0° C. to 85° C., Δf/f is within the range of the standard, within ±0.09 ppm. Therefore, the piezoelectric device 100 can satisfy the request for the standard of the high-accuracy TCXO.

Figure 4A:
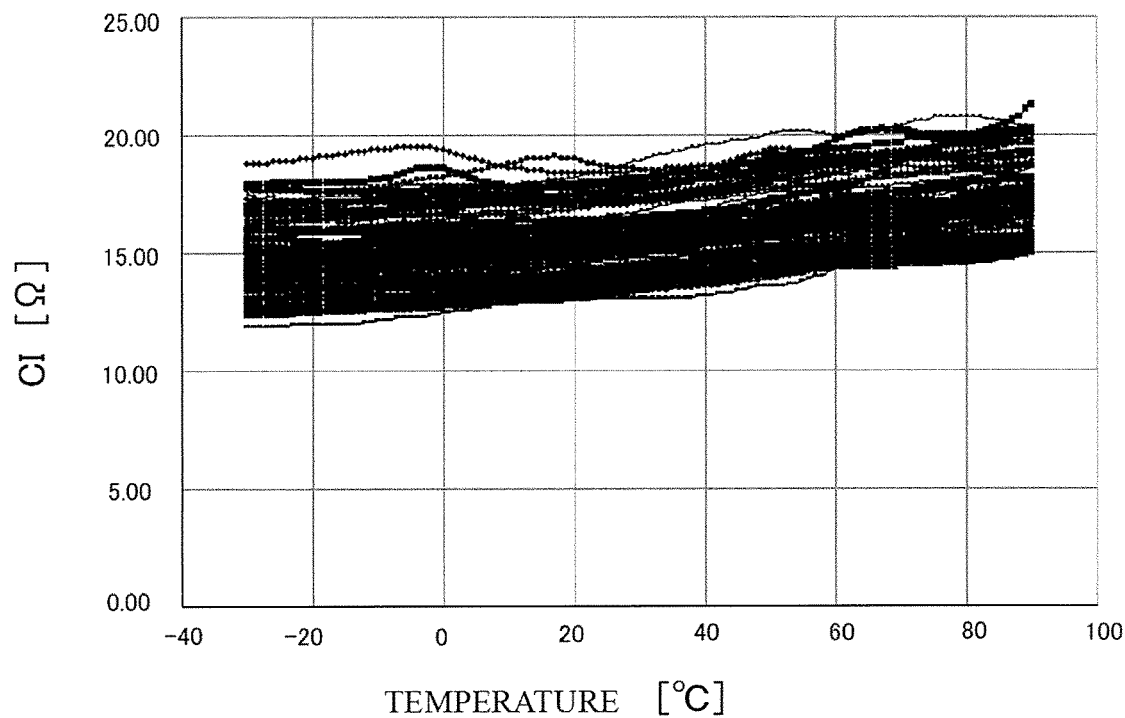
FIG. 4A is a graph showing a relation between the temperature and a CI of the conventional piezoelectric device.

FIG. 4A is a graph showing a relation between the temperature and the CI of the conventional piezoelectric device. FIG. 4A shows the crystal impedance (CI) in the temperature range of −30° C. to 90° C. for the 97 pieces of the conventional piezoelectric device shown in FIG. 3A. In FIG. 4A, the horizontal axis indicates the temperature [° C.], and the vertical axis indicates the crystal impedance (CI) [Ω]. At the conventional piezoelectric device, the CI is about 12Ω to about 18Ω at −30° C. As the temperature increases, the CI increases. The CI is in a range of about 15Ω to about 21Ω at 90° C. At the conventional piezoelectric device, in this temperature range of −30° C. to 90° C., ΔCI that is a value that a lowest value of the CI is subtracted from a highest value of the CI is about 35Ω.

Figure 4B:
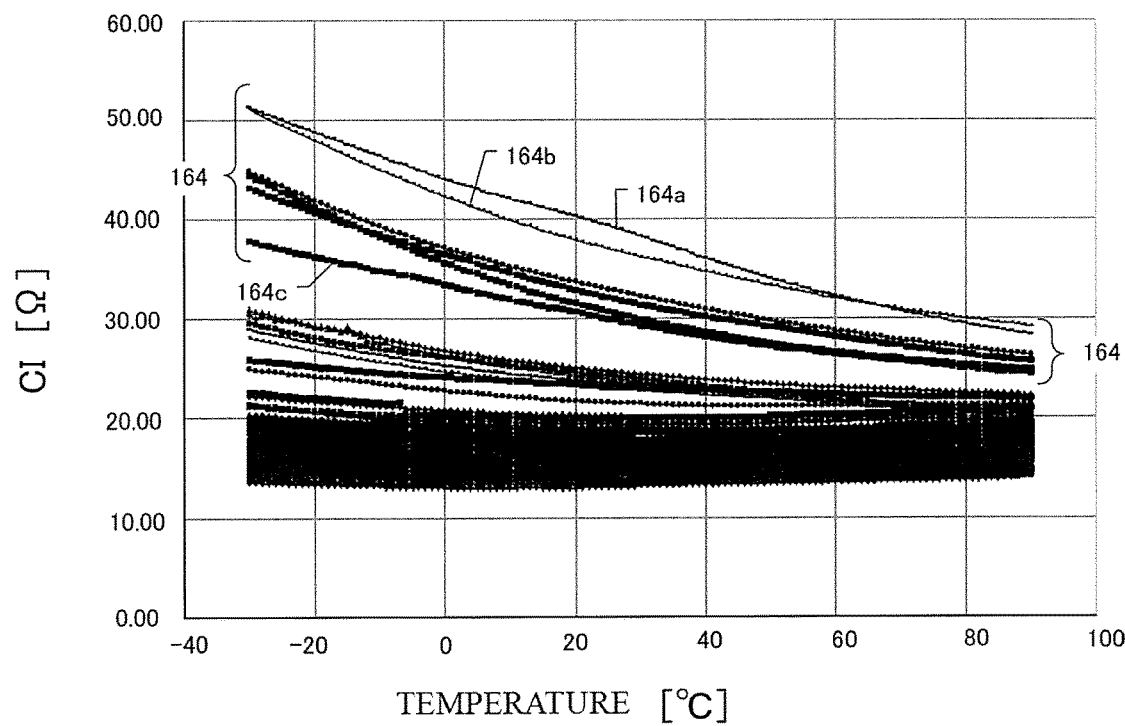
FIG. 4B is a graph showing a relation between the temperature and the CI of the piezoelectric device 100.

FIG. 4B is a graph showing a relation between the temperature and the CI of the piezoelectric device 100. FIG. 4B shows the crystal impedance (CI) in the temperature range of −30° C. to 90° C. for the 90 pieces of piezoelectric device 100 shown in FIG. 3B. In FIG. 4B, the horizontal axis indicates the temperature [° C.], and the vertical axis indicates the crystal impedance (CI) [Ω]. At the piezoelectric device 100 shown in FIG. 4B, the CI is in a range of about 13Ω to about 50Ω at −30° C., and the CI is in a range of about 13Ω to about 30Ω at 90° C.

At the piezoelectric device 100 shown in FIG. 4B, the distance XB takes various values. For example, at each of the piezoelectric devices 100 indicated by a working example 164a and a working example 164b shown in FIG. 4B, the distance XB is 0 mm. At the piezoelectric device 100 indicated by a working example 164c, the distance XB is about 0.1 mm. Therefore, in the working examples indicated by a range 164 whose CI is high in FIG. 4B, the distance XB is considered to be short. In a range removing the working examples in this range 164, the CI is in a range of less than about 30Ω at −30° C., and the CI is in a range of less than about 22Ω at 90° C. At the piezoelectric device 100, even if the working examples in the range 164 is removed, the CI tends to be slightly high compared with the conventional piezoelectric device. However, this increase range of the CI is within an allowable range, and has no problem on practical side. This has large advantage of the effect that can restrain the difference from the approximation property (Δf) to be slight (that is, Δf/f to be slight) as shown in FIG. 3B. Thus, comprehensively, the usage of the adhesive 152 has large advantage.

Figure 5:
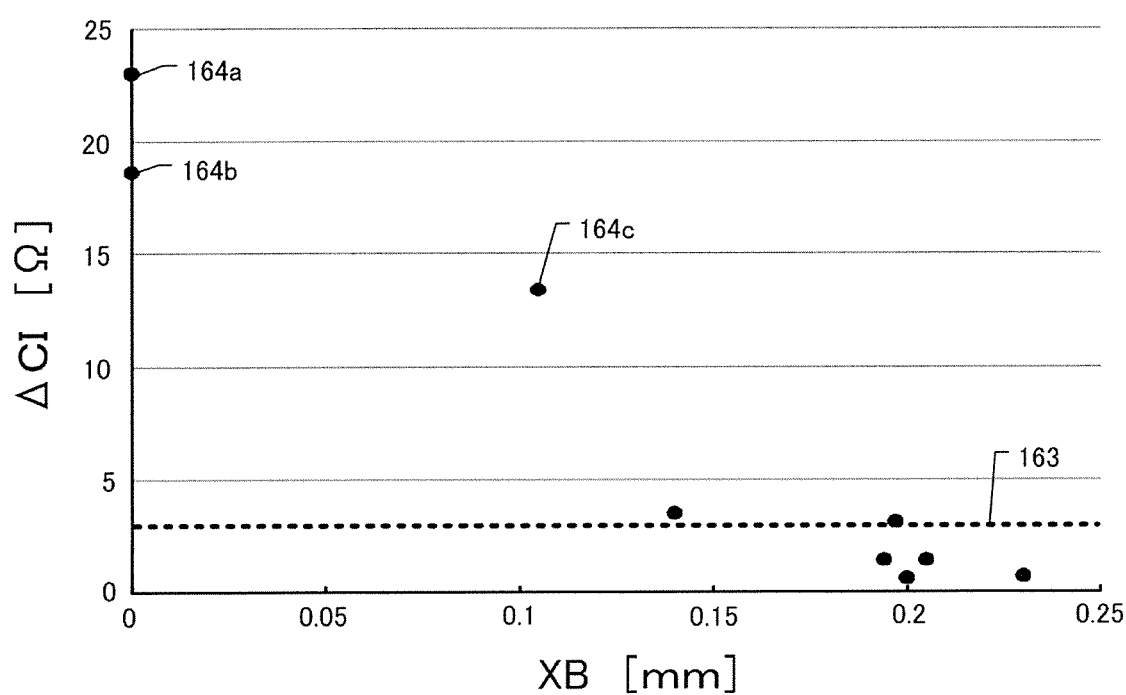
FIG. 5 is a graph showing a relation between a distance XB and ΔCI of the piezoelectric device 100.

FIG. 5 is a graph showing a relation between the distance XB and ΔCI of the piezoelectric device 100. In FIG. 5, the horizontal axis indicates the distance XB [mm], and the vertical axis indicates ΔCI [Ω]. The working example 164a, the working example 164b, and the working example 164c shown in FIG. 5 indicate the working example 164a, the working example 164b, and the working example 164c shown in FIG. 4B. In FIG. 5, a dotted line 163 that indicates 3Ω that is a value close to ΔCI of the conventional piezoelectric device is drawn.

At the piezoelectric device 100, when the distance XB is 0 mm, ΔCI takes a high value around 20Ω. When the distance XB is about 0.1 mm, ΔCI is 13.4Ω, decreased (that is, improved) compared with the case where the distance XB is 0 mm. When the distance XB is large, 0.14 mm, ΔCI is 3.5Ω. When the distance XB further becomes larger than this, ΔCI further decreases. FIG. 5 shows a working example where the distance XB is 0.23 mm as a case where the distance XB is maximum. However, if the distance XB becomes larger than this, this approaches the state of the conventional piezoelectric device. Thus, it is considered that ΔCI is kept in a low state even if the distance XB is extended.

When an identical degree of ΔCI as the conventional piezoelectric device is desired to be maintained at the piezoelectric device 100, it is preferable to take a value identical to ΔCI indicated by the dotted line 163 or a value smaller than ΔCI indicated by the dotted line 163. In FIG. 5, when the distance XB is 0.14 mm, ΔCI is 3.5Ω. Since it is considered that ΔCI further decreases when the distance XB further increases, it is considered that at least ΔCI equal to that of the conventional piezoelectric device is obtained when the distance XB is larger than 0.15 mm. In a vicinity where the distance XB is 0.2 mm, ΔCI is smaller than the dotted line 163 in many cases. This is considered to be further preferable.

On the other hand, the increase of the distance XB approaches the state of the conventional piezoelectric device. Thus, if the distance XB largely increases, since the slight undulation of Δf/f occurs in FIG. 3A, it is considered to increase the slight undulation of the difference from the approximation property (Δf). In FIG. 3B, the working examples of the piezoelectric device 100 when the distance XB is 0 mm to 0.23 mm are mainly shown. However, in FIG. 3B, since there is still room for the standard required at the high-accuracy TCXO, it is expected that, insofar as the distance XB is roughly up to around 0.25 mm, Δf/f is surely within a range of a standard value. That is, when ΔCI and Δf/f are considered, it is preferable that the distance XB is 0.15 mm to 0.25 mm, and more preferably 0.2 mm to 0.25 mm.

It is considered that an optimum distance XB modestly relates to a size of the piezoelectric vibrating piece. Therefore, a ratio of the length XA of the long side of the piezoelectric vibrating piece 140 to the distance XB is XB/XA=(0.15 mm to 0.25 mm)/3.2 mm=4.7% to 7.8%. Even if dimensions of an outer shape of the piezoelectric vibrating piece are modestly different from dimensions of an outer shape of the piezoelectric vibrating piece 140, it is considered that, insofar as the ratio of the length XA of the long side to the distance XB is 4.7% to 7.8%, the difference from the approximation property (Δf) can be reduced without degrading the CI and ΔCI.

When the adhesive 152 is applied on the piezoelectric vibrating piece 140, as shown in FIG. 4B and FIG. 5, the temperature characteristics such as the CI and ΔCI are possibly degraded depending on an applied position of the adhesive 152. At the piezoelectric device 100, the adhesive 152 is applied on the conductive adhesive 151 sides that are fixed ends of the piezoelectric vibrating piece 140 viewing from the excitation electrode 141 that is considered that the influence of the application of the adhesive 152 is lowest, and the distance XB between the excitation electrode 141 and the adhesives 152 is improved, thus decreasing the influence of the degradation of the temperature characteristics by the application of the adhesive 152. At the piezoelectric device 100, new fixed ends are not formed at the piezoelectric vibrating piece 140. Thus, it is estimated that there is also no degradation of hysteresis. The above-described measurement has been performed when the oscillation frequency (f) is 38.4 MHz. However, the measurement may be applied to other oscillation frequencies such as 20 MHz, 25.2 MHz, and 25 MHz.

Second Embodiment

The applied position and the applied state of the adhesive 152 may be modestly changed from the case in the first embodiment. The following describes a modification when the adhesive is applied on various positions or in various states.

[Configuration of Piezoelectric Device 200]

Figure 6A:
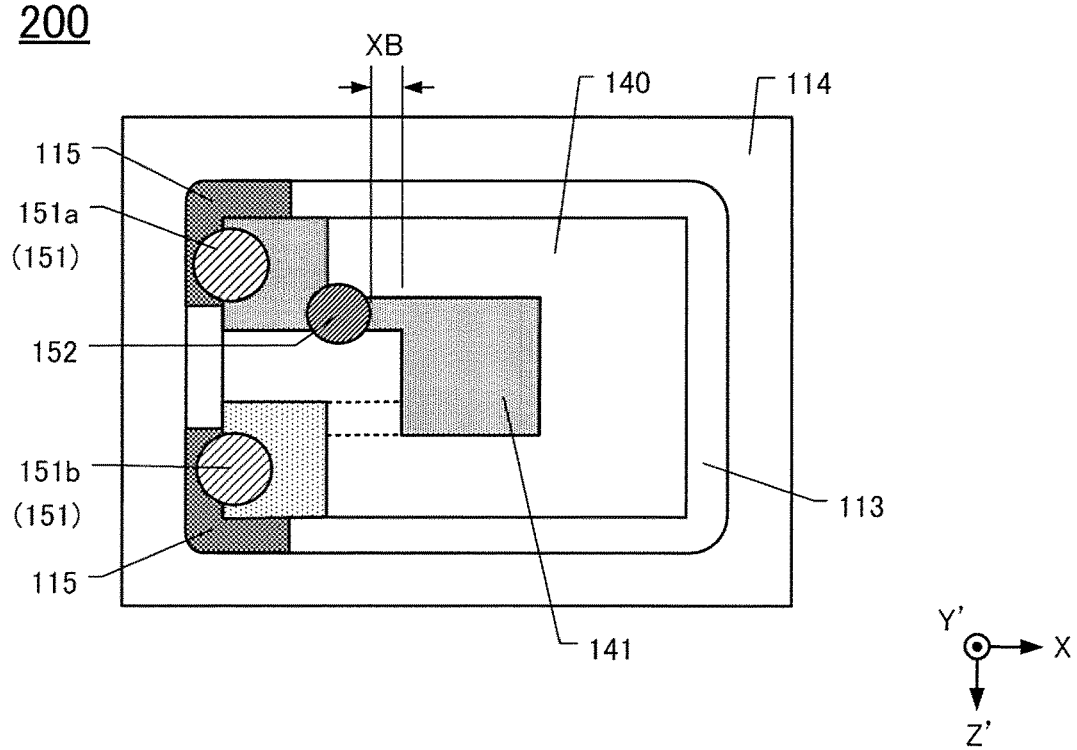
FIG. 6A is a plan view of a piezoelectric device 200 from which the lid 120 has been removed.

FIG. 6A is a plan view of a piezoelectric device 200 from which the lid 120 has been removed. The piezoelectric device 200 is includes the lid 120, the package 110, and the piezoelectric vibrating piece 140, and has an applied position of the adhesive 152 different from that of the piezoelectric device 100. At the piezoelectric device 200, the adhesive 152 applied on the top surface 140a of the piezoelectric vibrating piece 140 does not contact the conductive adhesive 151. The applied adhesive 152 is applied on only between the excitation electrode 141 and the conductive adhesive 151a, and is not applied on between the excitation electrode 141 and the conductive adhesive 151b. A distance between the excitation electrode 141 and the adhesive 152 is formed to XB.

At the piezoelectric device 200, the adhesive 152 is formed between the excitation electrode 141 and the conductive adhesive 151a. When the distance XB is formed to be an appropriate range as illustrated in the first embodiment, Δf/f can be reduced (that is, the difference from the approximation property (Δf) can be reduced) without degrading the CI and ΔCI.

[Configuration of Piezoelectric Device 300]

Figure 6B:
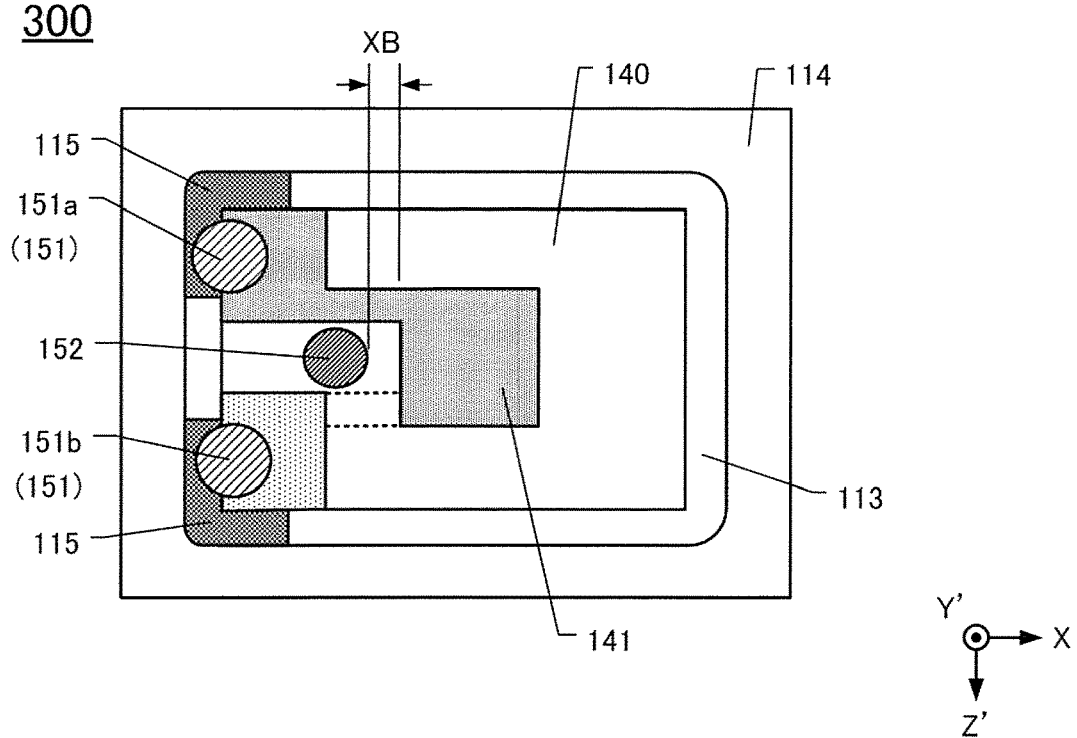
FIG. 6B is a plan view of a piezoelectric device 300 from which the lid 120 has been removed.

FIG. 6B is a plan view of a piezoelectric device 300 from which the lid 120 has been removed. The piezoelectric device 300 includes the lid 120, the package 110, and the piezoelectric vibrating piece 140, and has an applied position of the adhesive 152 different from that of the piezoelectric device 100. At the piezoelectric device 300, the adhesive 152 is applied on between the short side at the −X-axis side of the piezoelectric vibrating piece 140 and the excitation electrode 141.

The piezoelectric vibrating piece 140 has both ends of the short side at the −X-axis side secured with the conductive adhesive 151. Thus, it can be considered that the short side at the −X-axis side itself is the fixed end. When the adhesive 152 is applied on between this short side at the −X-axis side that is the fixed end and the excitation electrode 141, similarly to the piezoelectric device 100, the difference from the approximation property (Δf) can be reduced without degrading the CI and ΔCI.

Above all, the preferred embodiments of this disclosure are described in detail. It is apparent to those skilled in the art that a variety of variation and modification of the embodiment can be made within the technical scope of this disclosure. Also, the various combinations of the above-described embodiments can be made.

In the above description, the crystal unit alone has been exemplified as the piezoelectric device. However, this disclosure is also applicable to a piezoelectric device (the piezoelectric device as an oscillator) that includes an integrated circuit (IC) chip having a function that compensates frequency/temperature characteristics of an oscillator circuit that oscillates a piezoelectric vibrating piece and the piezoelectric vibrating piece in a region housing the piezoelectric vibrating piece of the package 110. This disclosure is also applicable to a piezoelectric device as an H-shaped oscillator that uses a package having what is called an H-shaped structure that has a depressed portion on an outside bottom surface of the package 110 to mount the above-described IC chip at this depressed portion.

The piezoelectric device of a second aspect according to the first aspect is configured as follows. A distance between the adhesive and the excitation electrode is 0.15 mm or more and 0.25 mm or less.

The piezoelectric device of a third aspect according to the second aspect is configured as follows. The distance between the adhesive and the excitation electrode is 0.2 mm or more.

The piezoelectric device of a fourth aspect according to the first aspect to the third aspect is configured as follows. The adhesive is applied on a position overlapping the extraction electrode in a height direction.

FIG. 7 is a perspective view of a piezoelectric device 100 which includes an integrated circuit chip that has an oscillator circuit and a temperature compensation function built-in. The piezoelectric device 100 of a fifth aspect according to the first aspect to the fourth aspect further includes an integrated circuit chip that has an oscillator circuit and a temperature compensation function built-in. The integrated circuit chip that has an oscillator circuit and i temperature compensation function built-in can be electrically connected to the piezoelectric device 100 via the mounting terminals 111.

With the piezoelectric device according to the embodiment, unnecessary vibration can be reduced without degrading a temperature characteristic.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A piezoelectric device, comprising:
a piezoelectric vibrating piece, having an outer shape formed into a rectangular shape, and the piezoelectric vibrating piece including: an excitation electrode formed on both principal surfaces which are a top surface and a lower surface, an electrode pad formed at both ends of one short side, and an extraction electrode extracted from the excitation electrode to the electrode pad to be electrically connected to the electrode pad;
a package, including a placement surface on which the piezoelectric vibrating piece is placed as opposed to the lower surface of the piezoelectric vibrating piece, and an adhesion pad formed on the placement surface; and
a conductive adhesive, securing the piezoelectric vibrating piece to the package and electrically connects the adhesion pad to the electrode pad,
wherein at the piezoelectric vibrating piece, an adhesive is applied on the top surface of the piezoelectric vibrating piece, and the adhesive is between the conductive adhesive and the excitation electrode.

2. The piezoelectric device according to claim 1, wherein a distance between the adhesive and the excitation electrode is 0.15 mm or more and 0.25 mm or less.

3. The piezoelectric device according to claim 2, wherein the distance between the adhesive and the excitation electrode is 0.2 mm or more.

4. The piezoelectric device according to claim 1, wherein the adhesive is applied on a position overlapping the extraction electrode in a height direction.

5. The piezoelectric device according to claim 1, further comprising:
an integrated circuit chip that has an oscillator circuit and a temperature compensation function built-in.

* * * * *